United States Patent
Bromberger

(10) Patent No.: US 7,488,663 B2
(45) Date of Patent: Feb. 10, 2009

(54) SEMICONDUCTOR ARTICLE AND METHOD FOR MANUFACTURING WITH REDUCED BASE RESISTANCE

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 389 days.

(21) Appl. No.: 11/266,209

(22) Filed: Nov. 4, 2005

(65) Prior Publication Data

US 2006/0099770 A1 May 11, 2006

(30) Foreign Application Priority Data

Nov. 5, 2004 (DE) .................. 10 2004 053 393

(51) Int. Cl.
*H01L 21/331* (2006.01)
(52) U.S. Cl. ............... 438/377; 257/573; 257/E21.387
(58) Field of Classification Search ............... 438/345, 438/377; 257/573, 576, E21.385, E21.507
See application file for complete search history.

(56) References Cited

U.S. PATENT DOCUMENTS

| | | | |
|---|---|---|---|
| 4,771,013 A | 9/1988 | Curran | |
| 5,340,753 A | 8/1994 | Bassous et al. | |
| 5,399,899 A | 3/1995 | Dekker et al. | |
| 5,424,227 A | 6/1995 | Dietrich et al. | |
| 5,459,084 A | 10/1995 | Ryum et al. | |
| 5,668,022 A | 9/1997 | Cho et al. | |
| 5,696,007 A | 12/1997 | Ryum et al. | |
| 6,177,717 B1 | 1/2001 | Chantre et al. | |
| 6,239,477 B1 | 5/2001 | Johnson | |
| 6,436,782 B2 | 8/2002 | Chantre et al. | |
| 6,465,317 B2 | 10/2002 | Marty | |
| 6,518,111 B1 | 2/2003 | Johnson | |
| 2002/0011605 A1 | 1/2002 | Twynam | |
| 2002/0168829 A1 | 11/2002 | Bock et al. | |
| 2003/0199153 A1 | 10/2003 | Kovacic et al. | |
| 2004/0014271 A1 | 1/2004 | Cantell et al. | |
| 2004/0089918 A1 | 5/2004 | Ohnishi et al. | |

FOREIGN PATENT DOCUMENTS

| | | |
|---|---|---|
| DE | 43 01 333 A1 | 7/1994 |
| DE | 693 15 813 T | 6/1998 |
| DE | 198 45 790 | 3/2000 |
| DE | 102 54 663 A1 | 6/2004 |
| EP | 0 248 606 A3 | 12/1987 |
| EP | 1 139 452 A2 | 10/2001 |
| JP | 5-275437 A | 10/1993 |

OTHER PUBLICATIONS

D. Knoll et al., "*A Flexible, Low-Cost, High-Performance SiGe: C BiCMOS Process with a One-Mask HBT Module*," IEEE-IEDM 2002, Article 31.6.1, pp. 783-786.
H. Ruecker et al., "*SiGe: C BiCMOS Technology with 3.6 ps Gate Delay*," IEEE-IEDM 2003, Technical Digest, Article 5.3.1, (4 pages).

*Primary Examiner*—W. David Coleman
(74) *Attorney, Agent, or Firm*—Muncy, Geissler, Olds & Lowe, PLLC

(57) ABSTRACT

A method for manufacturing a semiconductor article and a semiconductor article is provided, wherein a base region of a first semiconductor material is applied, a silicide layer is applied above the base region, after the application of the silicide layer, an opening is created in the silicide layer by removing the silicide layer within the area of the opening, and after this, an emitter region is formed within the opening.

30 Claims, 4 Drawing Sheets

SEMICONDUCTOR ARTICLE AND METHOD FOR MANUFACTURING WITH REDUCED BASE RESISTANCE

This nonprovisional application claims priority under 35 U.S.C. § 119(a) on German Patent Application No. DE 102004053393.8, which was filed in Germany on Nov. 5, 2004, and which is herein incorporated by reference.

BACKGROUND OF THE INVENTION

1. Field of the Invention

The present invention relates to a method for manufacturing a semiconductor article and a semiconductor article, particularly for high-frequency applications.

2. Description of the Background Art

DE 43 01 333 A1, which corresponds to U.S. Pat. No. 5,424,227, discloses different process steps in a manufacturing process for an NPN-silicon-germanium heterobipolar transistor with a P-silicon-germanium base layer. Reference is made to the entire scope of this publication and the process steps in FIGS. 1a to 1h are explained.

FIG. 1a: On the surface of a P-doped silicon substrate wafer $1s$, a (masking) oxide layer $10s$ is formed by thermal oxidation and patterned with photoresist; an N+ collector connection layer $2s$ ("buried layer") is formed by implantation and post-diffusion of arsenic ions.

FIG. 1b: After removal of the masking oxide layer $10s$, the layer sequence of the SiGe HBT is grown in a single process (for example, using molecular beam epitaxy MBE) without interruption, with simultaneous doping of the layers. The layer sequence comprises the N⁻-collector layer $3s$ (for example, with a layer thickness of 300 nm and a doping concentration of $10^{16}$ to $10^{17}$ cm$^{-3}$), the P⁺ SiGe base layer $4s$ (germanium proportion of, for example, 20%, layer thickness of 50 nm, and doping concentration of $10^{19}$ cm$^{-3}$), the N⁻-emitter layer $5s$ (for example, with a layer thickness of 100 nm and a doping concentration of $10^{18}$ cm$^{-3}$), and the N⁺ emitter contact layer $6s$ (for example, layer thickness of 50 nm and doping concentration exceeding $10^{20}$ cm$^{-3}$).

FIG. 1c: An auxiliary layer $11s$ (for example, of silicon nitride $Si_3N_4$) is deposited over the full surface of the N⁺ emitter contact layer $6s$ (for example, by a CVD method), with a layer thickness of approximately 0.3 μm and patterned with photoresist; part of the $Si_3N_4$ auxiliary layer $11s$ and the Si emitter contact layer $6s$ is etched off anisotropically—the emitter layer $5s$ continues to remain above the SiGe base layer $4s$.

FIG. 1d: A CVD oxide (TEOS) $12s$ (for example, having a layer thickness of 0.3 μm) is conformally deposited over the surface of the semiconductor array and etched back anisotropically in such a way that an oxide layer $12s$ (spacer) remains only at the vertical edges of the auxiliary layer $11s$ and of the emitter contact layer $6s$, and the remaining surface (for the base connection) is exposed; BF2 ions (dose, for example, $4 \times 10^{15}$ cm$^{-2}$, acceleration voltage, for example, 40-80 kV) are implanted in the exposed surface to a depth just below the SiGe base layer $4s$ and hence the emitter region $5s$ at the side of the oxide spacer $12s$ is redoped to provide the P⁺ base connection region $7s$, and the base collector PN junction $9s$ is moved to underneath the base/collector boundary layer $9as$, and the emitter/base/PN junction $8s$ to underneath the spacer oxide layer $12s$.

FIG. 1e: The final mesa-type structure is formed by the base connection region $7s$ and the collector layer $3s$ is patterned by anisotropic etching; by deposition and patterning of a CVD oxide (layer thickness, for example, 0.5 μm), field oxide regions $14s$ are formed that separate the various elements or active structures of the integrated circuit from one another.

FIG. 1f: By thermal oxidation at a temperature of, for example, 700° C., the exposed surface of the semiconductor array is covered with an $SiO_2$ layer $13s$ with a thickness of, for example, 10 nm. Both the base/emitter/PN junction $8s$ and the collector/base/PN junction $9s$ are passivated on the surface and hence protected from leakage currents.

FIG. 1g: A CVD oxide $15s$ (TEOS) is deposited over the entire surface of the semiconductor array (for example, with a layer thickness of 0.5 μm) and etched back anisotropically in such a way that, on the one hand, the collector contact opening $20s$ is formed and, on the other, oxide spacers $15s$ remain, which protect the surface of the base/emitter/PN junction $8s$ over a length $d_2$. The distances $d_1$ (from the edge of the emitter contact layer $6s$ to the base connection region $7s$) and $d_2$ (from the base connection region $7s$ to the later base metal layer $16s$) are self-aligned and minimal thanks to the spacer technique described and use of the oxide layers $12s$ and $15s$.

FIG. 1h: The remainder of the $Si_3N_4$ auxiliary layer $11s$ is removed, and the emitter contact opening $21s$ is exposed. By vapor deposition of a metal layer $16s$ (for example, titanium) and temperature treatment of said layer, a metal silicide (for example, titanium silicide) is formed on the surface of the silicon areas $2s$, $6s$, $7s$, whereas the pure metal remains on the surface of the oxide areas $13s$, $14s$, $15s$; the metal layer above the oxide areas $13s$, $14s$, $15s$ is selectively removed using an etchant solution. It is then possible, after application of an oxide layer and the manufacture of contact openings for emitter, base, and collector, to apply a metallized layer using conventional methods. SiGe HBTs of this type of FIG. 1h, however, can be produced not only on simply patterned substrates as described, but also, for example, on substrates already containing finished components in pure silicon technology (e.g., MOS or bipolar).

The base of the previously described transistor can be conceptually subdivided into an intrinsic base and an extrinsic base. The intrinsic base with the adjacent emitter and collector regions forms level and substantially parallel pn junctions, whereas the extrinsic base is made to provide the electrical connection of the intrinsic base to at least one external contact.

For many applications of bipolar transistors, thus, for example, for high-frequency power amplification, the base resistance is an important parameter, which limits the electrical properties of the transistors, particularly their cutoff frequency. Frequently, the base resistance is dominated by the resistance of the extrinsic base.

To reduce the resistance of the extrinsic base, the extrinsic base in a high-doped semiconductor material is made of the same type of dopant as the intrinsic base, but with a much greater layer thickness, in order to achieve a low layer resistance in this way. In the method taught by the publication "IEEE-IEDM 2002, Article 31.6.1," for example, the extrinsic base is made of polysilicon with a layer thickness that is far greater than the width of the intrinsic base. Moreover, the extrinsic base can be made as a high-doped implanted region.

In order to reduce the resistance of the extrinsic base of bipolar transistors in silicon technology, the extrinsic base is silicidized, as set forth, for example, in the publications U.S. Pat. Nos. 5,459,084, 6,177,717, US 2002/0168829, or U.S. Pat. No. 6,465,317. Here, a layer of a metal capable of reacting with silicon is applied to the extrinsic base and the layer is caused to react with the silicon material of the extrinsic base.

By annealing above a transformation point, the forming suicides are converted to a modification with a low specific resistance.

It is desirable for many applications, particularly in the high-frequency range, to introduce another semiconductor material, for example, germanium or carbon, in addition to silicon, into the intrinsic base of a bipolar transistor to manufacture a heterobipolar transistor. During the epitaxial deposition of the semiconductor material for the intrinsic base, the additional semiconductor material is also introduced into parts of the extrinsic base in addition to silicon. Germanium and carbon behave chemically like silicon, so that a metal capable of reacting with silicon also reacts with germanium or carbon under the same reaction conditions.

Particularly compounds of titanium and germanium exhibit a lower thermal stability than homologous compounds of titanium and silicon and dissociate at the transition point of the silicides. The germanium and titanium separation products formed during the dissociation act to increase the resistance.

In the presence of another semiconductor material (germanium) in the intrinsic base, it can therefore be desirable to carry out a silicidation reaction in such a way that the silicidation front does not penetrate deep into the intrinsic base. Nevertheless, a high silicide thickness is desirable to reduce base resistance.

As described previously in DE 43 01 333 A1, a thick emitter layer 5s is provided for this purpose, which has the function of keeping the silicon material available for a thick silicide layer 16s, without the silicidation front penetrating deep into the layer 4s of the silicon-germanium composition. A pn junction with a relatively large area is formed at the edge of the thick emitter area, the pn junction lying completely within the silicon. A relatively large silicon diode is connected in particular to the base/emitter diode of the heterobipolar transistor. This influences the electrical properties of the forming element and limits its geometric scaleability.

DE 198 45 790 A1 discloses a manufacturing process for SiGe heterobipolar transistors without large silicon edge transistors, in that for the wet-chemical thinning of silicon layers in the active emitter region of a bipolar transistor, additional doping, having a thickness less than 3 nm, introduced by means of "atomic layer doping" (ALD) in a cover layer, acts as an etch stop layer for wet-chemical etchant. The etch stop layer is subsequently removed with a wet-chemical etchant.

The layer growth of the cover layer occurs further above the etch stop layer as single crystals, so that with the aid of a silicon etchant, the single-crystal silicon of the cover layer can be removed highly selectively to the etch stop layer and to a dielectric. In an embodiment of the method of DE 198 45 790 A1, the epitaxial deposition of the thick emitter layer is interrupted by the application of the thin etch stop layer, for example, consisting of high-p-doped silicon, which acts as an etch stop, at the site of the emitter window during selective, wet-chemical thinning of the thick emitter layer for deepening the emitter window.

The publication "IEEE IEDM 2003, Technical Digest, Article 5.3.1" also describes a manufacturing method with relatively large edge transistors in which a high silicide thickness is achieved on the extrinsic base, whereas simultaneously the silicidation front above the germanium-containing layer is brought to a standstill. To that end, after the completion of the emitter contact, the silicon material is deposited exclusively above the extrinsic base by selective epitaxy and then silicidized.

A further disadvantage of the prior art arises from the fact that a silicide-silicon interface, forming during the silicidation, is generally formed unevenly. There is the particular risk of the formation of needle-shaped or pyramidal silicide crystallites, which project into the silicon area. To avoid a short circuit ("spike") between the silicide layer on the extrinsic base and the emitter region, accordingly, a sufficient lateral distance must be provided between the silicide edge and the emitter edge. As a result, the bulk resistance of the extrinsic base is detrimentally increased.

In particular, in the methods as taught in the publications U.S. Pat. Nos. 6,518,111 and 6,239,477, it is endeavored to reduce the base bulk resistance portion due to the non-silicidized region of the extrinsic base. In this regard, a large minimum distance is maintained between the emitter window and the extrinsic base to prevent base-emitter short circuits through laterally growing silicide crystals, the so-called spikes. To reduce the resistance, the region of the extrinsic base, which is situated between the silicide and the intrinsic base, is doped as highly as possible by dopants from a solid dopant source, without detrimentally affecting the properties of the base/emitter PN junction.

U.S. Pat. No. 6,518,111 provides a dielectric diffusion source layer (borosilicate glass) as a dopant source to reduce the layer resistance of the contact region between the intrinsic base and an extrinsic base of polysilicon, whereas U.S. Pat. No. 6,239,477 provides doping between the intrinsic base and a silicidized extrinsic base. US 2004/0014271 provides a selectively epitaxially deposited, highly doped silicon layer as the solid source.

SUMMARY OF THE INVENTION

It is therefore an object of the present invention to reduce a base resistance as much as possible, with the disadvantages of large lateral expansion and the effects of parasitic edge transistors, which can form between contact regions, being reduced to the greatest extent possible.

Accordingly, a method for manufacturing a semiconductor article is provided by applying a base region of a first semiconductor material and a silicide layer above the base region. The silicide layer thereby is used preferably as an electrical contact to the base area. For good electrical conductivity, the silicide layer is applied either adjacent to the base region or on a thin intermediate layer (cap layer) made of a semiconductor material.

After the application of the silicide layer, an opening can be created in the silicide layer by removing the silicide layer within the area of the opening. As a result, any silicide is removed in this opening, so that at least a surface of the monocrystalline semiconductor material underneath the silicide layer is exposed.

After this, an emitter region is formed within the opening. The emitter region is thereby formed preferably in such a way that the emitter region and the base region can form a PN junction, which is formed within a monocrystalline region of the semiconductor material.

A high-frequency bipolar transistor (HBT) may be advantageously manufactured by means of this method. Furthermore, it is conceivable to manufacture other components, such as thyristors, diodes, or double diodes, and entire digital logic circuits.

An embodiment of the invention provides that a first semiconductor layer can be inserted between the base region and the silicide layer by applying the first semiconductor layer to a first surface of the base region before the application of the silicide layer. This semiconductor layer preferably has a dopant concentration lower by at least an order of magnitude than the base region. For example, the conductivity type of the dopants in this first semiconductor layer is of the same type as the base region. It is advantageous for the first semiconductor layer to have a thickness of less than 20 nm.

In another embodiment, insertion of a second semiconductor layer between the silicide layer and the first semiconductor layer is provided. Preferably, this second semiconductor layer is removed as a result of the creation of an opening for the emitter region. In so doing, the second semiconductor layer is inserted by applying the second semiconductor layer on a (second) surface of the first semiconductor layer before the application of the silicide layer. Thus, the second semiconductor layer preferably has a higher dopant concentration than the first semiconductor layer. It is advantageous for the dopant concentration to be at least an order of magnitude higher. Here, the dopant introduced in the second semiconductor layer is of the same conductivity type as the dopant contained in the base region. The dopants can be advantageously introduced in situ during the epitaxial application of the second semiconductor layer or alternatively implanted afterwards. It is advantageous for the second semiconductor layer to have a thickness of less than 20 nm.

An advantageous embodiment of the invention provides that the opening is created with a depth of at least to the second surface of the first semiconductor layer or to the first surface of the base layer. Advantageously, the opening is formed to a depth so that above the base region monocrystalline semiconductor material remains, which is appropriately doped as a part of the emitter semiconductor region with the insertion of the emitter region and after the doping advantageously has a conductivity type that is opposite to that of the conductivity type of the base region.

A first embodiment of the invention provides that the silicide layer is etched by masking in the area of the opening for the creation thereof. Preferably, an etchant is used for the etching that permits selective etching of the silicide layer relative to the underlying monocrystalline semiconductor material.

A second, alternative embodiment, provides that the opening is created by a lift-off process step. To this end, before the application of the silicide layer, a photoresist mask is patterned and subsequently the silicide layer is applied by sputtering of a silicide target. Subsequently, the patterned photoresist mask is removed, so that the opening is formed in the silicide layer.

An advantageous embodiment of the invention provides that the emitter region is made self-aligned within the opening. To that end, the edges of the opening of the silicide layer define the outside dimension of the emitter region, so that the emitter region within the opening is formed symmetrically. To that end, it is advantageously provided that to form the emitter region within the opening, internal spacers are formed, between which a spacer opening is created and then a conductive layer or layer sequence is applied. The internal spacers serve to position the active emitter semiconductor region below the spacer opening. Furthermore, the internal spacers and optionally another dielectric are used for insulating the emitter contact from the silicide layer and/or the base region. As a result, the region of the intrinsic base is set by the internal spacers. The extrinsic base thereby extends from the intrinsic base to below the silicide layer, whereby the semiconductor region of the base region of the extrinsic base is covered at least for the most part by the silicide layer for connection contacting.

In order to contact the emitter region with as low a voltage as possible, an advantageous development of the invention provides that in the conductive layer or layer sequence a dopant, corresponding to a first conductivity type of the emitter region, is incorporated, which is diffused into the monocrystalline semiconductor layer within the area of the spacer opening in an annealing step, so that the conductive layer or layer sequence acts as a dopant source. The inward diffusion, in so doing, is limited by the appropriate temperature/time selection preferably to a region below the spacer opening between the internal spacers.

To contact the base with as low a voltage as possible and to avoid Schottky contacts, a development of the invention provides that in the suicide layer and/or in the second semiconductor layer, a dopant corresponding to a second conductivity type of the base region is incorporated. The dopant is diffused in an annealing step into the first semiconductor layer and/or into the base region outside the area of the opening for the emitter region, so that the silicide layer and/or the second semiconductor layer act as a dopant source.

Also, the conductive layer sequence can be made of an underlying, particularly polycrystalline silicon layer of the first conductivity type and an overlying additional silicide layer.

In this regard, the polycrystalline silicon layer is preferably highly doped such that it has a dopant concentration greater than XXX $cm^{-3}$.

The silicide layer or the additional silicide layer can be applied by applying a silicon layer and one or more metal layers, particularly a titanium layer and/or a cobalt layer to a forming and a silicidation occurs thereafter. Dopants may be implanted selectively before and/or after the silicidation, preferably by an appropriate masking.

The silicide layer or the additional silicide layer can be applied in a second advantageous embodiment of the invention by sputtering a silicide-containing target. Dopants may be incorporated in situ during the sputtering process.

Further, the base region can have at least one silicon-germanium layer by applying a mixture of silicon and germanium during the epitaxial application of the base region. Advantageously, this silicon-germanium layer is covered by a protective layer, for example, by the first semiconductor layer, to prevent a reaction of the germanium with a metal applied during the formation of the silicide layer.

Another aspect of the invention is a high-frequency array, particularly a bipolar transistor, which can be manufactured according to a previously described method. This high-frequency array has a base region made of a semiconductor material and a silicide layer that is placed above the base region and is formed to provide an electrical connection to the base region. An opening is etched in the silicide layer, within which an emitter region is introduced, which is electrically insulated from the silicide layer by an insulating layer, for example, a dielectric.

Another aspect of the invention provides for a method for manufacturing a semiconductor article, in this case, in particular a tetrode. In this regard, a first base region and a second base region are formed. The two base regions are preferably connected separately from one another and are advantageously controlled separately by different base currents.

An intermediate base region, which preferably has a monocrystalline semiconductor material that is adjacent to both base regions, is formed between the first base region and the second base region. A collector region is formed adjacent to the first base region. Accordingly, the second base region of a first semiconductor material, for example, Si or SiGe, is applied.

A silicide layer is applied above the first base region. After the application of the silicide layer, an opening is created in the silicide layer by removing the silicide layer within the area of the opening. After this, an emitter region, adjacent to the second base region, is formed within the opening.

A contact layer can be applied, which borders the first base region. The contact layer is made of, for example, a silicide material, which is combined with foreign substances, preferably a material from group 3A of the periodic system (boron, etc.), which acts as a dopant in an adjacent semiconductor material, so that the contact layer serves as a dopant diffusion source for the adjacent semiconductor regions.

In another embodiment, the invention, the contact layer can be insulated from the collector region by application of a first dielectric and/or from the intermediate base region by application of a second dielectric. This type of dielectric is, for example, $SiO_2$ or $Si_3N_4$.

A base window, in which one or more monocrystalline semiconductor layers of the first base region are selectively deposited epitaxially, can be opened at least in the contact layer. Advantageously, one of the monocrystalline semiconductor layers is made of a mixed crystal, for example, SiGe.

Another embodiment provides that to form the intermediate base region on the second dielectric and on the exposed semiconductor layer of the first base region, at least a portion of the semiconductor material of the intermediate base layer is deposited amorphously and is crystallized by solid phase epitaxy proceeding from the exposed semiconductor layer of the first base region as a crystallization nucleus.

The contact layer can be formed from deposited or boron-doped cobalt silicide prepared by silicidation. To this end, in a first embodiment of the invention, the contact layer is formed by deposited in-situ boron-doped cobalt silicide, whereas in a second embodiment, the contact layer is formed by implantation of boron-doped cobalt silicide. An annealing step is advantageously performed after the deposition of the contact layer. Another aspect of the invention is another high-frequency array, here preferably a tetrode. This may be manufactured by the previously described method.

The high-frequency device has a first base region having a semiconductor material and a second base region. An intermediate base region made of a semiconductor material is placed between the first base region and the second base region. Moreover, a collector region, adjacent to the first-base region, and an emitter region, adjacent to the second base region, are provided.

Furthermore, the high-frequency array has a connection region which is adjacent to the electrical connection of the first base region. In this regard, the first base region is made in a connection region opening as monocrystalline semiconductor material by selective epitaxy. The emitter region is introduced into an opening, which is etched in a silicide layer made to provide an electrical connection for the second base region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
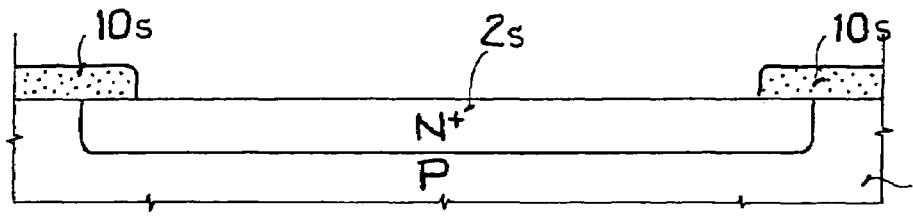
FIG. 1a to 1h are a schematic drawing of a manufacturing process for an HBT according to the conventional art.
Figure 1B:
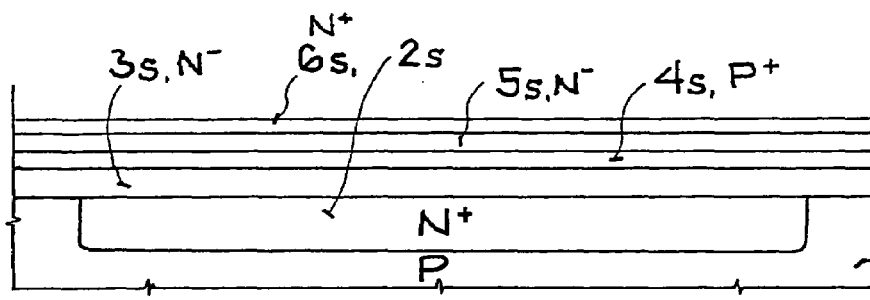
Figure 1C:
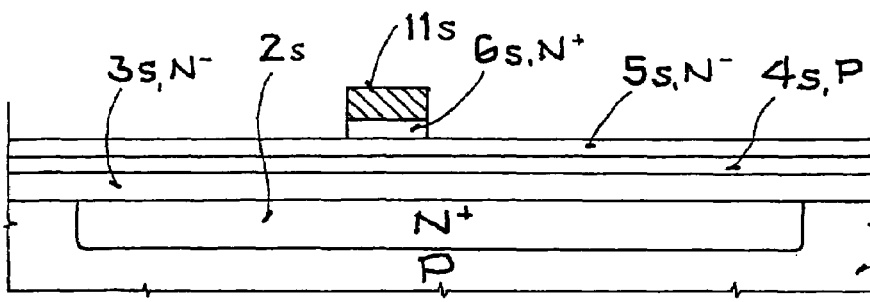
Figure 1D:
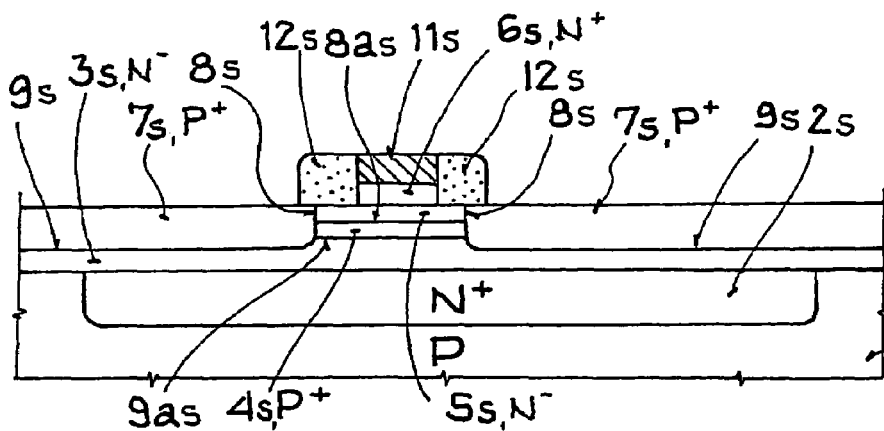
Figure 1E:
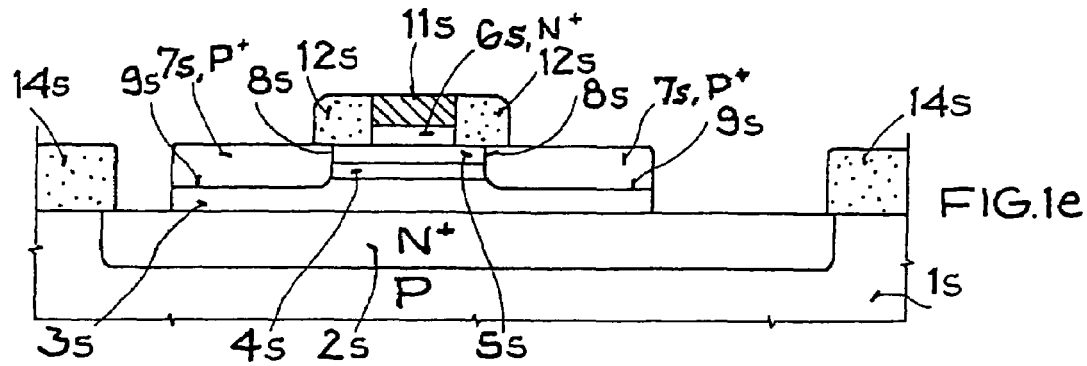
Figure 1F:
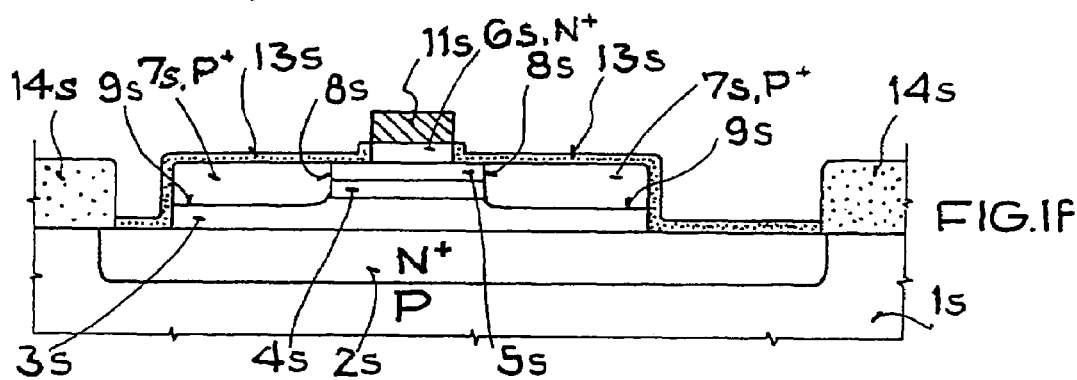
Figure 1G:
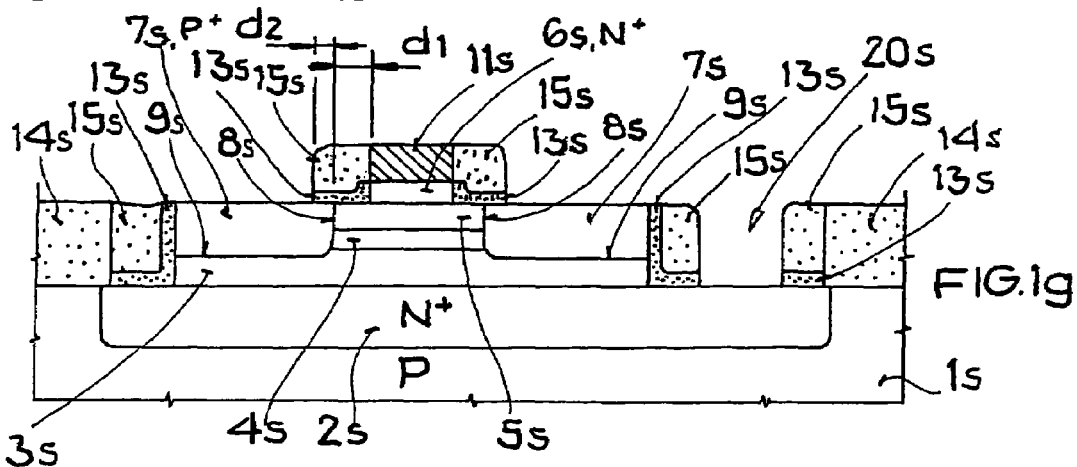
Figure 1H:
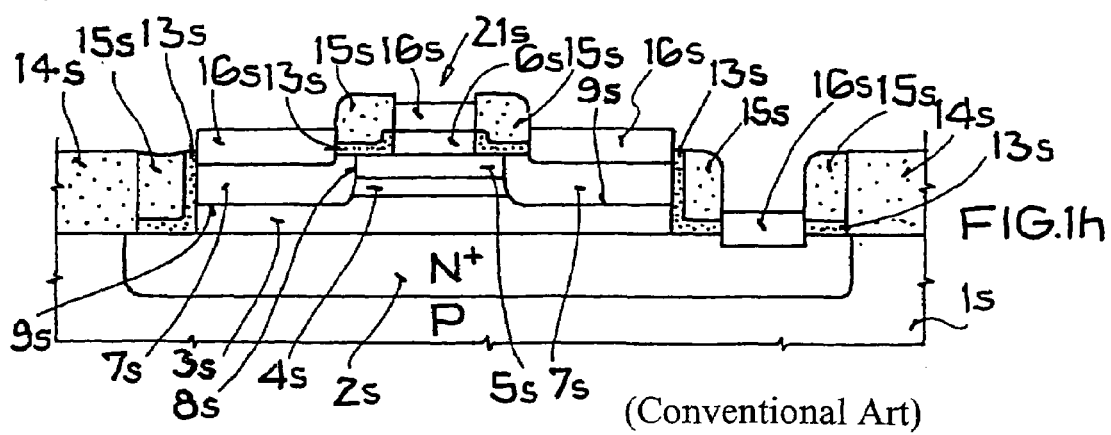

In a first exemplary embodiment for manufacturing a high-frequency bipolar transistor (HBT), the following fabrication steps are performed. For simplification, detailed process steps are omitted such as cleaning of surfaces, etc.:

Introduction of a buried $n^+$-layer 90 into a silicon wafer and
Epitaxial growth of 450 nm silicon 9, 2e16 $cm^{-3}$ As-doped,
Etching of a flat STI trench insulation with nitride hard mask and
Filling with thermal and/or applied oxide,
Back etching of the oxide with STI inverse mask and
Oxide CMP with nitride hard mask as a polishing stop,
Base epitaxy, with the steps
  5 nm $n^-$-Si starting layer,
  10 nm intrinsic SiGe layer,
  5 nm $p^+$-SiGe layer,
  5 nm intrinsic SiGe layer,
  10 nm boron-doped $p^+$-Si layer 4,
  10 nm boron-doped $p^+$-Si cap layer 40 as diffusion source,
Sputter deposition of 100 nm $CoSi_2$ and
Deposition of 200 nm plasma $Si_3N_4$,
Removal of the $Si_3N_4$ layer 8 at places where an emitter window is planned,
Deposition of 200 nm plasma $Si_3N_4$ and
$Si_3N_4$ back etching for a time period, nominal removal 250 nm (spacer etching),
$CoSi_2$ dry etching for a time period, for example, $Cl_2:O_2$ plasma with a selectivity of 30:1 to the underlying silicon with about 2 to 3 nm Si removal,
Si soft etch with 5 nm Si removal.

Figure 2:
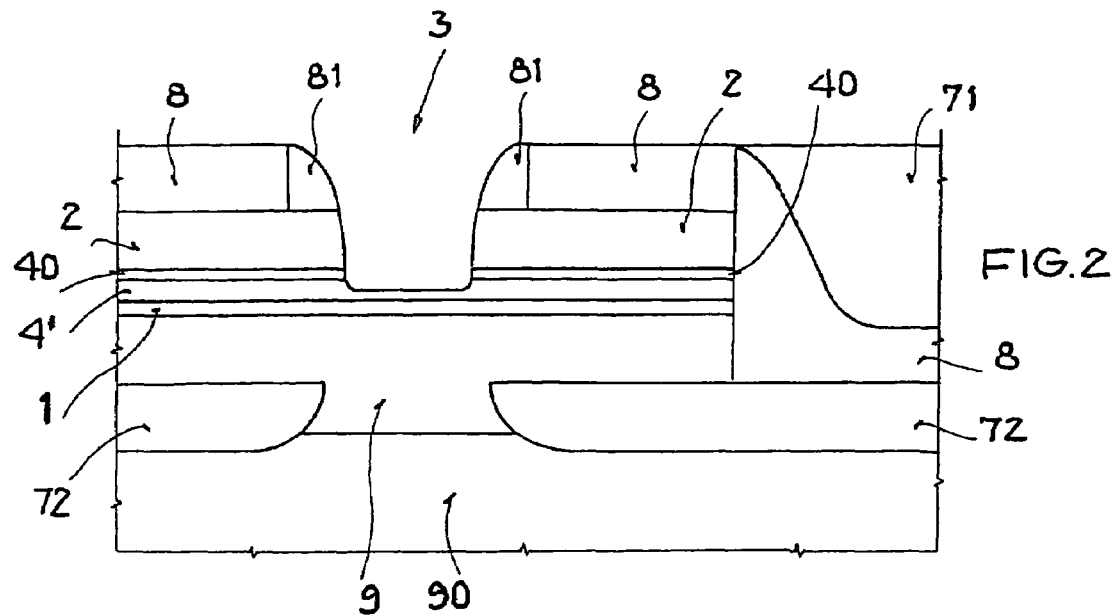
FIG. 2 is a schematic sectional drawing of a manufacturing stage of an HBT.

The manufacturing process status after these process steps is shown schematically in FIG. 2. In this case, the following conductivity types apply to a high-frequency npn-bipolar transistor. The collector region is formed by an $n^+$-doped, buried layer 90 and by an $n^-$-layer 9, whereby these layers 90 and 9 are adjacent to one another between two dielectric layers 72 and in this region continue the crystal lattice of the substrate. The base region 1, which for a simplified presentation in this exemplary embodiment has only one layer, is located on the $n^-$-layer 9. A first semiconductor layer 4 and a second semiconductor layer 40, which in contrast to the base region 1 have no germanium, are located on the base region 1. Furthermore, a dielectric of a $Si_3N_4$ layer 8 and a $SiO_2$ layer 71 is provided to separate this high-frequency semiconductor array from other high-frequency semiconductor arrays.

A silicide layer 2, in which an opening 3 is etched by a hard mask from the $Si_3N_4$ layer 8 and the spacers 81, is located above the second semiconductor layer 40 and thus also above the base region 1, whereby the emitter region is formed within this opening in subsequent steps.

Figure 3:
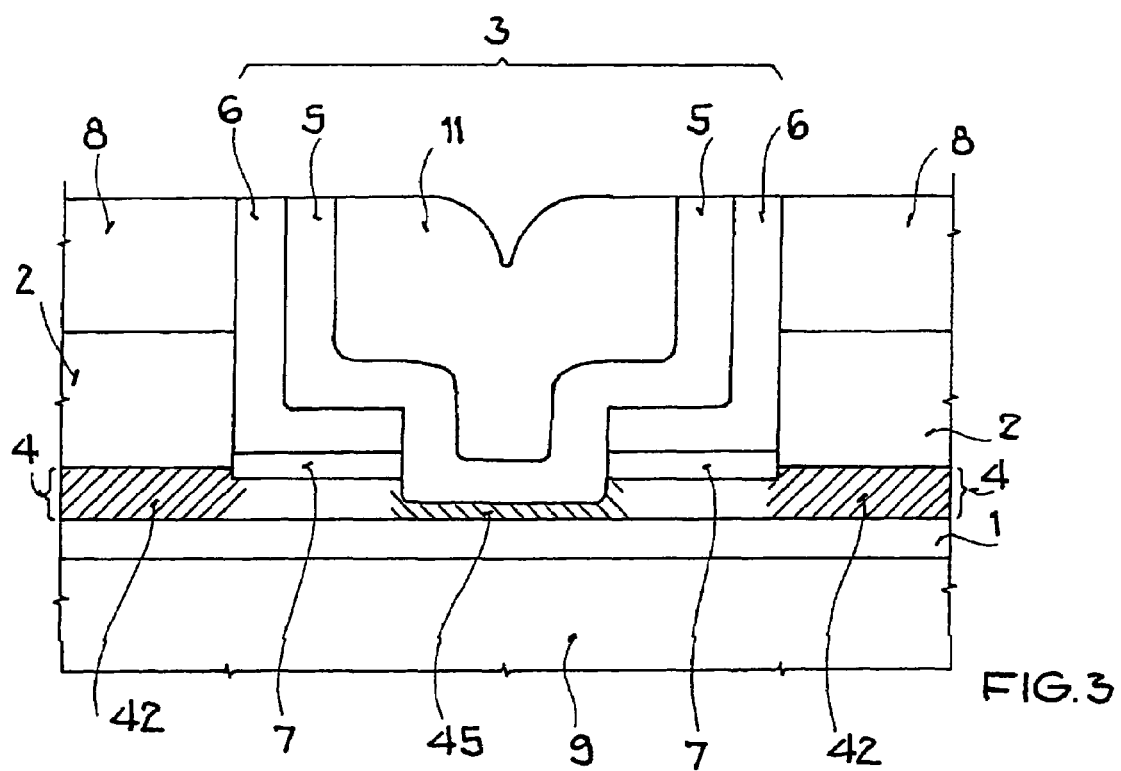
FIG. 3 is a schematic sectional drawing of a detail of an HBT.

FIG. 3 in another exemplary embodiment of the invention schematically shows a sectional view through the base/emitter region of an npn-high-frequency bipolar transistor. As in FIG. 2, layer 9 forms a portion of a low n-doped collector region, on which the p-dopant base region 1 is placed. Only a semiconductor layer 4 is placed above the base region 1, and above this in turn a silicide layer 2 and a hard mask of $Si_3N_4$ (8) are placed. An opening 3 extends through the silicide layer 2 within which the emitter region (5, 11) is located.

Within the opening 3, there are two internal spacers 6, each located above a thermal oxide 7. A polycrystalline, $n^+$-(high) doped silicon, which also fills a spacer opening between the two internal spacers 6, is applied adjacent to the internal spacers 6. The remaining part of the opening 3 of the emitter region is filled with a silicide 11 and optionally other metallic conductors (not shown in FIG. 3).

The polysilicon 5, moreover, serves as a dopant source for doping the monocrystalline semiconductor layer 4 in the emitter region 45, which here is high $n^+$-doped due to dopants from the polysilicon 5 and forms the active emitter region 45. Furthermore, the silicide layer 2 acts as a dopant source, whereby the first semiconductor layer 4 in the area of the extrinsic base 42 is high $p^+$-doped. This enables an especially low-resistance connection of the extrinsic base 42, 1.

Figure 4:
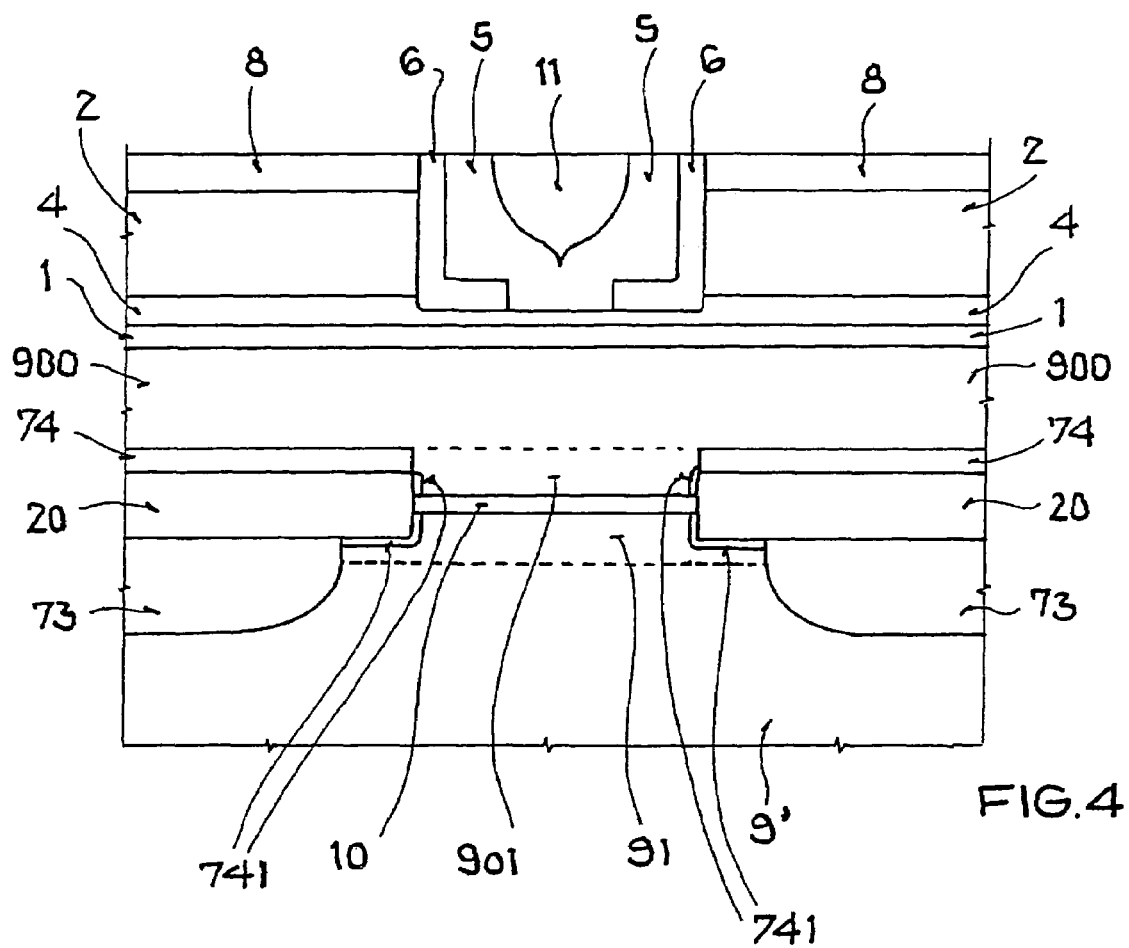
FIG. 4 is a schematic sectional drawing of a tetrode.

FIG. 4 shows a vertically integrated cascode structure in a schematic sectional drawing. The designations 2, 4, 5, 6, 8, and 11 correspond to the exemplary embodiment of FIG. 2. FIG. 2, however, shows a detail of a high-frequency bipolar transistor, whereas FIG. 3 shows a schematic drawing of a high-frequency cascode structure. Therefore, a first base region 10 and a second base region 1 are provided in FIG. 3. Above the second base region 1, the structure of the vertically integrated cascode structure corresponds to the bipolar transistor of FIG. 2.

An intermediate base region 900 is placed between the first base region and the second base region. This intermediate base region 900 has a conductivity type opposite to the conductivity type of the two base regions 1, 10. In this exemplary embodiment, the base regions 1, 10 are p-doped, whereas the intermediate base region 900 is n-doped.

To connect the first base region 10, a silicide layer 20 is provided, which is insulated by a dielectric 73, 74, for example, $SiO_2$, from the collector region 9 and the intermediate base region 900. A monocrystalline semiconductor material, which forms a stack of the layers 91, 10 and 901, is applied by selective epitaxy between the silicide regions 20. Both the first base region and the second base region have a SiGe mixed crystal.

The silicide layer 20 in the exemplary embodiment is combined with boron and acts as a solid source under the effect of temperature for doping the adjacent silicon regions 91, 901. During this process, p-doped edge regions 741 form around the silicide layer 20. Short circuits between the silicide layer 20 and the n-doped layers 9, 91 and 901 are avoided in this way.

To manufacture the vertically integrated cascode structure of FIG. 4, the following manufacturing steps are preferably carried out:

Creating a collector region from the hard mask covering collector layer 9 on a first silicon surface,
Selectively removing the collector layer 9 portions not covered by the hard mask,
Thermal oxidation of the silicon surface exposed after the selective removal of the collector layer,
Depositing a first dielectric layer 73,
Removing the material, lying above the hard mask surface facing away from the first silicon surface, of the first dielectric layer 73,
Removing of the hard mask,
Applying a layer sequence of a contact layer 20, whereby the contact layer is made of silicide material and is combined with a material from group 3A of the periodic system, so that this contact layer 20 functions as a solid diffusion source for adjacent semiconductor regions 10,
Applying a second dielectric layer 74,
Opening a base window within the collector region in the second dielectric layer 74 and the contact layer 20,
Selective epitaxial deposition of a first monocrystalline semiconductor layer 10 or a first monocrystalline semiconductor layer stack in the opening of the base window, the first monocrystalline semiconductor layer 10 having a first p-doped SiGe layer or the stack of a SiGe layer,
Non-selective deposition of an amorphous, n-doped silicon layer,
Crystallization of the amorphous, n-doped silicon layer by solid phase epitaxy to at least a portion of the intermediate base layer 900, proceeding from the first monocrystalline semiconductor layer 10 or the semiconductor layer stack, so that at least areas of the intermediate base layer 900 are made monocrystalline.

For the area above the intermediate base layer 900, the process steps are similar to those for the bipolar transistor.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing a semiconductor article, comprising the steps of: providing a base region of a first semiconductor material;
applying a silicide layer above the base region;
creating, after the application of the silicide layer, an opening in the silicide layer by removing a portion of the silicide layer within the area of the opening; and
forming an emitter region within the opening.

2. The method according to claim 1, wherein a first semiconductor layer is inserted between the base region and the silicide layer by applying the first semiconductor layer to a first surface of the base region before the application of the silicide layer.

3. The method according to claim 1, wherein the emitter region is formed to be self-aligning within the opening.

4. The method according to claim 1, wherein, to form the emitter region within the opening, internal spacers are formed and then a conductive layer or layer sequence is applied.

5. The method according to claim 1, wherein the silicide layer or an additional silicide layer is applied in that a silicon layer and one or more metal layers, particularly a titanium layer and/or a cobalt layer are applied.

6. The method according to claim 1, wherein the silicide layer or an additional silicide layer is applied by sputtering a silicide-containing target.

7. The method according to claim 1, wherein the base region has at least one silicon-germanium layer.

8. The method according to claim 1, wherein the semiconductor article is a bipolar transistor.

9. The method according to claim 2, wherein a second semiconductor layer is inserted between the silicide layer and the first semiconductor layer by applying the second semiconductor layer on a second surface of the first semiconductor layer before the application of the silicide layer, and wherein the second semiconductor layer has a higher dopant concentration than the first semiconductor layer.

10. The method according to claim 9, wherein the opening is created with a depth of at least to the second surface of the first semiconductor layer or to the first surface of the base region.

11. The method according to claim 9, wherein, in the silicide layer and/or in the second semiconductor layer, a foreign substance is introduced, which during an annealing step diffuses outside the area of the opening into the first semiconductor layer and/or into the base region and acts as a dopant having a second conductivity type within the first semiconductor layer, so that the silicide layer and/or the second semiconductor layer acts as a dopant source.

12. The method according to claim 4, wherein, in the conductive layer or layer sequence, a foreign substance is incorporated, which during an annealing step diffuses into the semiconductor layer in the area of the opening and acts as a dopant having a first conductivity type within the semiconductor layer, so that the conductive layer or layer sequence acts as a dopant source.

13. The method according to claim 4, wherein the conductive layer sequence is formed from an underlying polycrystalline or amorphous silicon layer having a first conductivity type and an overlying additional silicide layer.

14. A method for manufacturing a semiconductor article, the method comprising the steps of:
forming a first base region and a second base region;
forming an intermediate base region between the first base region and the second base region;
forming a collector region adjacent to the first base region; the second base region is formed from a first semiconductor material;
applying a silicide layer above the second base region;
creating, after the application of the silicide layer, an opening in the silicide layer by removing the silicide layer within the area of the opening; and
forming an emitter region, adjacent to the second base region, within the opening.

15. The method according to claim 14, wherein the first base region, the second base region, and/or the intermediate base region are formed as layers that form horizontal interfaces to one another.

16. The method according to claim 14, wherein a contact layer is applied adjacent to the first base region, the contact layer being made of a silicide material, which is combined with at least one foreign substance, which can act as a dopant in a semiconductor material adjacent to the silicide material, and which can act as a diffusion source for doping a semiconductor region adjacent to the contact layer.

17. The method according to claim 14, wherein the semiconductor article is a vertically integrated cascode structure.

18. The method according to claim 16, wherein the contact layer is insulated from the collector region by a first dielectric.

19. The method according to claim 16, wherein a base window, in which one or more monocrystalline semiconductor layers of the first base region are selectively deposited epitaxially, is opened at least in the contact layer.

20. The method according to claim 16, wherein the contact layer is formed from deposited cobalt silicide or boron-combined cobalt silicide that is prepared by silicidation.

21. The method according to claim 16, wherein an annealing step is performed after the deposition of the contact layer.

22. The method according to claim 18, wherein the contact layer is insulated from the intermediate base region by a second dielectric.

23. The method according to claim 22, wherein, to form the intermediate base region on the second dielectric and on the exposed semiconductor layer of the first base region, at least a portion of the semiconductor material of the intermediate base layer is deposited amorphously and is crystallized by solid phase epitaxy proceeding from the exposed semiconductor layer of the first base region as a crystallization nucleus.

24. The method according to claim 20, wherein the contact layer is formed of deposited in-situ boron-combined cobalt silicide.

25. The method according to claim 20, wherein the contact layer is formed of cobalt silicide boron-doped by implantation.

26. The method according to claim 21, wherein epitaxial or deposition steps following the application of the contact layer act as annealing steps.

27. A semiconductor article comprising:
a base region formed of a semiconductor material; a silicide layer that is provided above the base region and formed to provide an electrical connection for the base region; and
an opening being etched in the silicide layer, within which an emitter region is introduced and which is electrically insulated from the silicide layer by an insulator layer.

28. The semiconductor article according to claim 27, wherein the semiconductor arcticle is a high-frequency bipolar transistor.

29. A semiconductor article comprising:
a first base region;
a second base region;
a first silicide layer above said second base region;
an intermediate base region formed between the first base region and the second base region;
a collector region provided adjacent to the first base region;
an emitter region provided adjacent to the second base region;
a contact region provided adjacent to the first base region to provide an electrical connection, and
a second silicide layer between said collector region and said contact region,
wherein the first base region in a connecting region opening is formed from monocrystalline semiconductor material by selective epitaxy, and wherein the emitter region is introduced into an opening, which is introduced into said silicide layer, for electrical connection of the second base region.

30. The semiconductor article according to claim 29, wherein the semiconductor arcticle is a vertically integrated high-frequency cascode structure.

* * * * *